(12) United States Patent
Tanabe et al.

(10) Patent No.: US 11,026,348 B2
(45) Date of Patent: Jun. 1, 2021

(54) ELECTRONIC DEVICE

(71) Applicant: SHARP KABUSHIKI KAISHA, Sakai (JP)

(72) Inventors: Hiroki Tanabe, Sakai (JP); Hidenori Kuwajima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/590,279

(22) Filed: Oct. 1, 2019

(65) Prior Publication Data
US 2020/0107473 A1    Apr. 2, 2020

(30) Foreign Application Priority Data

Oct. 2, 2018 (JP) .............................. JP2018-187623

(51) Int. Cl.
| | | |
|---|---|---|
| H05K 7/20 | (2006.01) | |
| G06F 1/20 | (2006.01) | |
| G06F 1/16 | (2006.01) | |
| H05K 9/00 | (2006.01) | |
| H04B 1/3888 | (2015.01) | |

(52) U.S. Cl.
CPC ....... *H05K 7/20436* (2013.01); *G06F 1/1626* (2013.01); *G06F 1/203* (2013.01); *H04B 1/3888* (2013.01); *G06F 1/1637* (2013.01); *G06F 1/1656* (2013.01); *H05K 9/0049* (2013.01)

(58) Field of Classification Search
CPC ...... G06F 1/203; G06F 1/20; G06F 2200/201; G06F 1/206; G06F 1/1626; G06F 1/1637; G06F 1/1656; H05K 7/20409; H05K 5/0217; H05K 9/0047; H05K 9/0007; H05K 7/20418; H05K 1/0203; H05K 7/20436; H04B 1/3888; H04B 1/036
See application file for complete search history.

(56) References Cited

U.S. PATENT DOCUMENTS

| | | | | |
|---|---|---|---|---|
| 6,025,991 A * | 2/2000 | Saito | .................. | H05K 7/20436 165/185 |
| 6,445,583 B1 * | 9/2002 | Kline | .................. | H01L 23/3675 165/80.3 |
| 6,673,998 B1 * | 1/2004 | Wu | ...................... | H05K 7/2049 174/383 |
| 6,881,077 B2 * | 4/2005 | Throum | ............... | H05K 5/0052 439/76.1 |
| 7,082,034 B2 * | 7/2006 | Tiwari | ................ | H01L 23/3675 165/185 |
| 7,724,526 B2 * | 5/2010 | Hinze | .................... | H01L 23/367 165/104.33 |
| 8,111,513 B2 * | 2/2012 | Yeh | .......................... | G06F 1/20 165/104.33 |

(Continued)

FOREIGN PATENT DOCUMENTS

JP        2016-092371 A    5/2016

*Primary Examiner* — Adam B Dravininkas
(74) *Attorney, Agent, or Firm* — ScienBiziP, P.C.

(57) ABSTRACT

Provided is an electronic device including a metal plate that is exposed on at least one of a plurality of side surfaces of the electronic device so as to absorb heat from a heat generating component that generates heat inside the electronic device and guide the heat to an outside of the electronic device. In addition, an outer surface of the metal plate exposed to the outside is formed further inside the electronic device than a first member and a second member.

6 Claims, 5 Drawing Sheets

(56) References Cited

U.S. PATENT DOCUMENTS

| | | | | |
|---|---|---|---|---|
| 9,362,040 B2* | 6/2016 | Rai | ............ | H05K 7/20927 |
| 9,694,451 B1* | 7/2017 | Ross | ............ | H05K 7/20545 |
| 9,736,964 B2* | 8/2017 | Proctor | ............ | H05K 7/20436 |
| 2005/0141209 A1* | 6/2005 | Chen | ............ | H05K 9/0039 |
| | | | | 361/800 |
| 2006/0187643 A1* | 8/2006 | Tsurufusa | ............ | H05K 7/2049 |
| | | | | 361/704 |
| 2006/0187645 A1* | 8/2006 | Numata | ............ | H05K 7/2049 |
| | | | | 361/704 |
| 2012/0050988 A1* | 3/2012 | Rothkopf | ............ | H04M 1/0266 |
| | | | | 361/688 |
| 2012/0217983 A1* | 8/2012 | Sinha | ............ | H05K 7/20509 |
| | | | | 324/697 |
| 2012/0307455 A1* | 12/2012 | Ritter | ............ | H05K 7/20445 |
| | | | | 361/720 |
| 2013/0050942 A1* | 2/2013 | Konishi | ............ | H05K 7/20127 |
| | | | | 361/692 |
| 2013/0294030 A1* | 11/2013 | Wang | ............ | G06F 1/203 |
| | | | | 361/700 |
| 2014/0085829 A1* | 3/2014 | Yamashita | ............ | H05K 1/0204 |
| | | | | 361/717 |
| 2014/0240922 A1* | 8/2014 | Watanabe | ............ | H04M 1/0202 |
| | | | | 361/679.54 |
| 2014/0262161 A1* | 9/2014 | Weigand | ............ | G06F 1/203 |
| | | | | 165/104.33 |
| 2015/0137345 A1* | 5/2015 | Choi | ............ | H01L 23/04 |
| | | | | 257/713 |
| 2016/0118366 A1* | 4/2016 | Jang | ............ | H01L 23/367 |
| | | | | 257/773 |
| 2016/0301442 A1* | 10/2016 | Sohn | ............ | H04M 1/19 |
| 2017/0025960 A1* | 1/2017 | Joo | ............ | H01F 27/22 |
| 2017/0094831 A1* | 3/2017 | Khorrami | ............ | H05K 9/0081 |
| 2017/0105278 A1* | 4/2017 | Cooper | ............ | H05K 3/321 |
| 2018/0035528 A1* | 2/2018 | Kim | ............ | G06F 1/203 |

* cited by examiner

FIG.1A  Cross-section along line A-A

FIG.1B  Cross-section along line B-B

Cross-section along line A-A

FIG.4

FIG.5A  Cross-section along line A-A

FIG.5B  Cross-section along line B-B

FIG.6A  Cross-section along line A-A

FIG.6B  Cross-section along line B-B

US 11,026,348 B2

ELECTRONIC DEVICE

BACKGROUND

1. Field

The present disclosure relates to an electronic device.

2. Description of the Related Art

In the related art, research on heat dissipation of an electronic device has been made. In Japanese Unexamined Patent Application Publication No. 2016-92371 (Published on May 23, 2016), an air-cavity is provided in a housing cover in order to restrict heat dissipation to a place where a user touches. In addition, by providing a high thermally conductive component inside the housing cover, the temperature in an external appearance portion is made uniform.

In this present disclosure, it is desirable to realize an electronic device that is able to efficiently conduct heat generated inside the electronic device to the outside of the electronic device from a place where the user is not apt to touch.

SUMMARY

According to an aspect of the present disclosure, there is provided an electronic device including a heat dissipation member having a higher thermal conductivity than a first member constituting a front surface of the electronic device and a second member constituting a back surface of the electronic device and being disposed inside electronic device, in which the heat dissipation member is exposed on at least one of a plurality of side surfaces of the electronic device so as to absorb heat from a heat generating component that generates heat inside the electronic device and guide the heat to an outside of the electronic device, and an exposed surface of the heat dissipation member exposed to the outside is formed further inside the electronic device than the first member and the second member.

Advantageous Effects of Invention

An aspect of the disclosure advantageously provides an electronic device that is able to efficiently conduct heat generated inside the electronic device to the outside of the electronic device from a place where the user is not apt to touch.

DESCRIPTION OF THE EMBODIMENTS

Hereinafter, embodiments of the present disclosure will be described in detail with reference to FIGS. 1A to 6B. Note that FIGS. 1A to 6B show an overview of an electronic device of the present application in order to facilitate understanding. That is, it may be noted that FIGS. 1A to 6B (particularly cross-sectional diagrams) are different from actual electronic devices in terms of dimensions and structure.

Embodiment 1

Figure 1A:
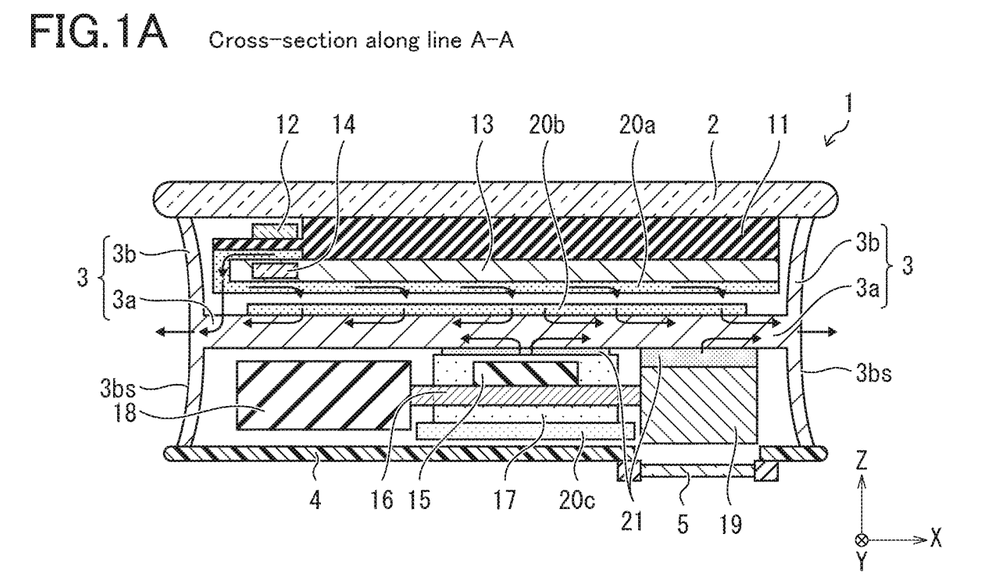
FIG. 1A is a schematic cross-sectional diagram showing an example of an electronic device according to Embodiment 1.
Figure 1B:
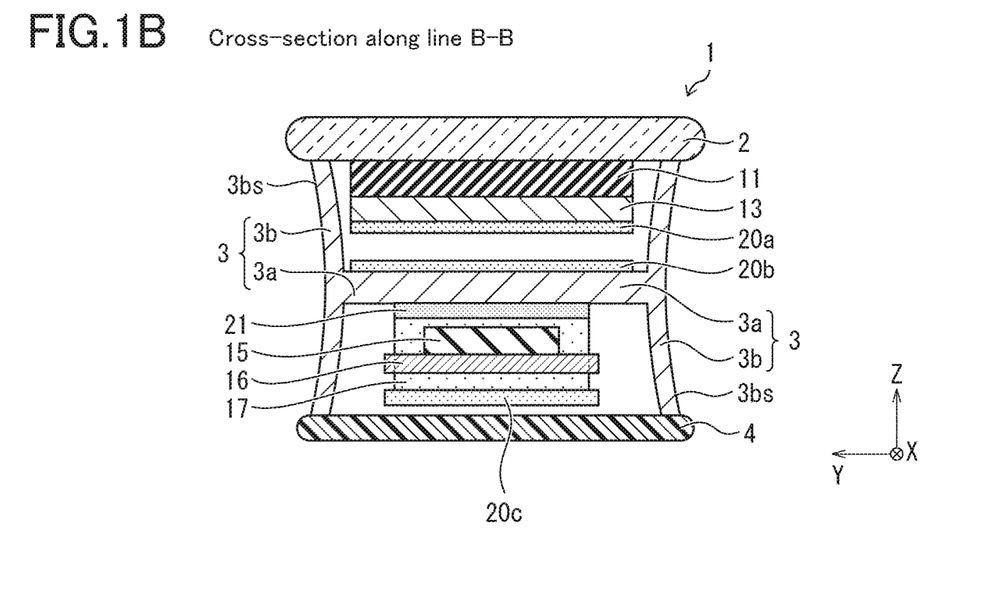
FIG. 1B is a schematic cross-sectional diagram showing an example of an electronic device according to Embodiment 1.

First, an embodiment of the present disclosure will be described in detail with reference to FIGS. 1A, 1B, and 2. FIG. 1A is a schematic arrow guiding cross-sectional diagram taken along line A-A showing an example of an electronic device 1 according to Embodiment 1, and FIG. 1B is a schematic arrow guiding cross-sectional diagram taken along line B-B showing an example of the electronic device 1 according to Embodiment 1. FIG. 1 is a perspective diagram showing an example of an external appearance of the electronic device according to Embodiment 1. In FIG. 1A, an example of flow of heat generated from a heat generating component is represented by arrows.

<Overview of Electronic Device 1>

Figure 2:
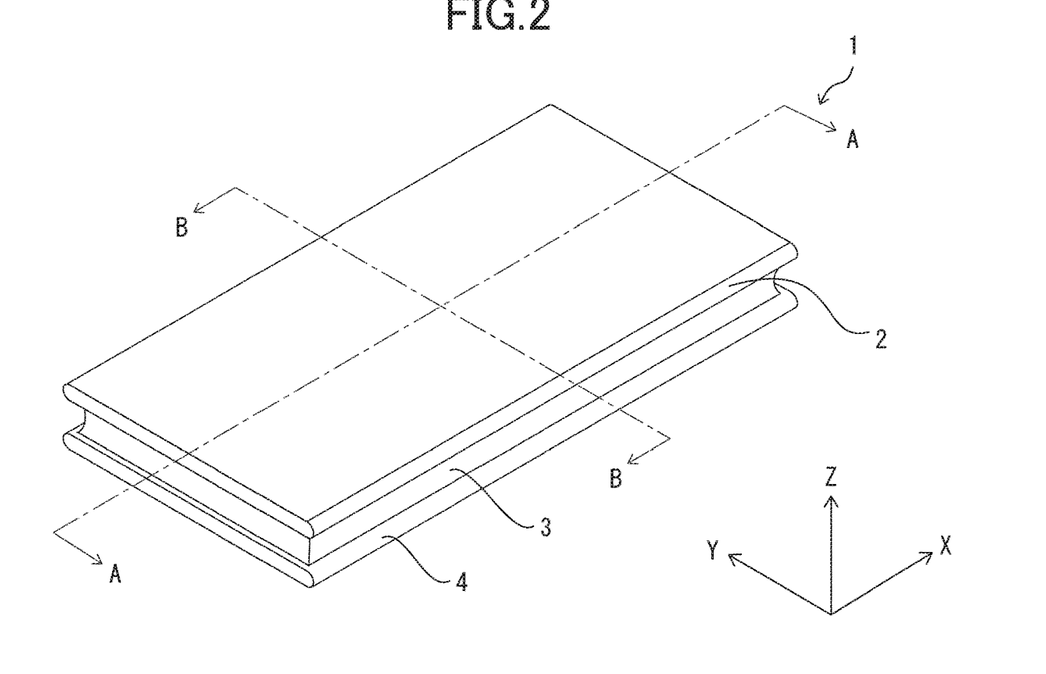
FIG. 2 is a perspective diagram showing an example of an external appearance of the electronic device according to Embodiment 1.

As shown in FIG. 2, the electronic device 1 includes a first member 2 that constitutes a front surface of the electronic device 1, a second member 4 that constitutes a back surface of the electronic device 1, and a metal plate 3 that is disposed between the first member 2 and the second member 4 and constitutes a side surface of the electronic device 1. As shown in FIG. 1A, a lens 5, which is disposed in front of a camera 19 built in the electronic device 1, is provided on the back surface of the electronic device 1.

The electronic device 1 is a portable-type multifunctional information processing terminal (portable terminal) such as a smartphone or a tablet. The first member 2 and the second member 4 are covers that protect the inside of the electronic device 1. The first member 2 is made of, for example, glass so that a user can visually recognize an image displayed by a liquid crystal unit 11 (after-mentioned). The second member 4 is made of, for example, resin. The lens 5 is made of, for example, glass or plastic resin.

The first member 2 and the second member 4 are portions where a user's hand (or fingers) is apt to touch when the user holds or operates the electronic device 1. Therefore, when a material having high thermal conductivity such as the metal plate 3 is used as the first member 2 and the second member 4, the amount of heat generated inside the electronic device 1 is transmitted to the user more than a material having low thermal conductivity. In this case, since it is easy for the user to feel hotter than the material having low thermal conductivity, there may be a possibility that some users feel uncomfortable. In order to reduce the possibility, the first member 2 and the second member 4 are made of a material having a lower thermal conductivity than at least the metal plate 3 (a member used as a heat dissipation member) disposed between the first member 2 and the second member 4. The lens 5 may be included in the second member 4 as a member constituting the back surface of the electronic device 1.

The first member 2 and the second member 4 may be made of a material having low thermal conductivity so that it is difficult for the user to feel discomfort due to beat, and may be made of a plurality of materials. The first member 2 may include, for example, glass disposed at least above a liquid crystal unit 11 (+Z axis direction) and a resin disposed so as to cover the surroundings of the glass. The second member 4 may be made of glass. The thermal conductivity of the material used for the first member 2 and the second member 4 may be, for example, 10 W/(m·K) or less, desirably 1.0 W/(m·K) or less.

As shown in FIGS. 1A and 1B, the electronic device 1 includes, for example, the liquid crystal unit 11, a driver circuit 12, a backlight unit 13, a light-emitting diode (LED) 14, a control circuit 15, a substrate 16, and a shield case 17.

The liquid crystal unit 11 includes a liquid crystal panel or the like that displays an image. The driver circuit 12 is a liquid crystal driver circuit that performs image display control on the liquid crystal unit 11 by controlling driving of the liquid crystal unit 11. The backlight unit 13 guides light from the LED 14 to the liquid crystal unit 11.

In the present embodiment, a display system is configured with the liquid crystal unit 11, the driver circuit 12, the backlight unit 13, and the LED 14, but is not limited thereto. For example, the display system of the electronic device 1 may include an organic light emitting diode (OLED) and a driver circuit (corresponding to the driver circuit 12) that controls driving of the OLED. The display system may include, for example, an inorganic light emitting diode or quantum dot light emitting diode (QLED) instead of the OLED.

The control circuit 15 controls each component included in the electronic device 1 in an integrated manner, and includes, for example, a central processing unit (CPU) and a graphics processing unit (GPU). The control circuit 15 is disposed on the substrate 16 and is sealed by the shield case 17 that blocks electromagnetic waves from the control circuit 15 or the outside. The shield case 17 is made of, for example, metal.

Further, the electronic device 1 includes a battery 18 that is a power supply source for each component of the electronic device 1 and a camera 19 that captures an image of an object via the lens 5. In the example of FIGS. 1A and 1B, examples of the heat generating components that generate heat inside the electronic device 1 include a display system (particularly, the driver circuit 12 and the LED 14), the control circuit 15, and the camera 19. In the electronic device 1, all components that can affect the operation of its own components or surrounding components by generating heat during operation correspond to a heat generating component. In the electronic device 1, various heat generating components including the display system, the control circuit 15, and the camera 19 are mounted as heat generating components.

<Heat Dissipation Structure>

As described above, the electronic device 1 includes the metal plate 3. The metal plate 3 is a heat dissipation member having a higher thermal conductivity than the first member 2 and the second member 4. Therefore, the metal plate 3 can absorb heat generated inside the electronic device 1 in preference to the first member 2 and the second member 4.

Further, as shown in FIGS. 1A, 1B, and 2, the metal plate 3 is exposed from all side surfaces constituting the electronic device 1 so as to guide heat to the outside of the electronic device 1 by absorbing the heat of the heat generating components. Therefore, the metal plate 3 can conduct the absorbed heat to the exposed surface of the metal plate 3 (exposed surface that is exposed to the outside in the metal plate 3) that is exposed to the outside from the side surface of electronic device 1, and can conduct (heat dissipation) from the exposed surface to the outside of the electronic device 1. That is, by providing the metal plate 3, the electronic device 1 can efficiently conduct heat generated locally inside the electronic device 1 to the outside of the electronic device 1 while diffusing the heat. Therefore, since it is possible to avoid that the heat generating component or the surrounding components become hot due to beat generation of the heat generating component, the performance of various components included in the electronic device 1 can be maintained, and the lifetime can be extended. Note that in this specification, the side surfaces of the electronic device refers to four surfaces other than the front and back surfaces of the electronic device.

As the metal plate 3, for example, aluminum or an aluminum alloy is used. The heat dissipation member does not desirably need to be the metal plate 3, and may be a member having a thermal conductivity that can absorb heat generated inside the electronic device 1 and conduct the heat efficiently to the outside of the electronic device 1. The heat dissipation member may be made of, for example, a thermal interface material (TIM) such as a resin such as silicone mixed with a thermally conductive filler.

However, when the metal plate 3 used, the heat generated inside the electronic device 1 can be efficiently diffused throughout the electronic device 1. Further, when the metal plate 3 is used, by the exposed surfaces described above, the electronic device 1 having a metal-specific texture (luxury feeling) can be provided to a user.

The thermal conductivity of the material used as a heat dissipation member may be, for example, a relatively high value with respect to the thermal conductivity of the material (example: glass or resin) used as the first member 2 and the second member 4, and may be desirably 100 W/(m·K) or more. Regarding this thermal conductivity, the absorbed heat can be efficiently conducted to the inside or the outside.

As shown in FIGS. 1A and 1B, the metal plate 3 includes a first metal plate 3a disposed inside the electronic device 1 and a second metal plate 3b constituting the side surfaces of the electronic device 1. Specifically, outer surfaces 3bs of the second metal plate 3b constitutes the side surfaces and the exposed surfaces of the electronic device 1.

In the present embodiment, the first metal plate 3a is extended inside the electronic device 1 near the center thereof so as to efficiently absorb heat generated by the display system disposed above, and heat generated by the control circuit 15 and the camera 19 disposed below (−Z axis direction), and to conduct the heat to the second metal plate 3b. However, the first metal plate 3a may be disposed in a position that can efficiently absorb the heat generated by various heat generating components.

In the present embodiment, the metal plate 3 is integrally molded. That is, the first metal plate 3a and the second metal plate 3b are integrally molded. In this case, the heat generated by the heat generating component can be efficiently conducted to the outside of the electronic device 1. However, the metal plate 3 may not be integrally molded, and the first metal plate 3a and the second metal plate 3b may be coupled to each other.

The electronic device 1 also includes heat dissipation sheets 20a to 20c and a thermally conductive member 21 that absorb heat generated by the heat generating component and conduct the heat to the outside.

The heat dissipation sheet 20a is disposed in the vicinity of the driver circuit 12 and the LED 14, and is affixed to a surface of the backlight unit 13 that faces the first metal plate 3a (the surface opposite to the surface coupled to the liquid crystal unit 11; the lower surface). Specifically, the heat dissipation sheet 20a is affixed over a wide range across the lower surface of the backlight unit 13. Thereby, the heat dissipation sheet 20a can conduct heat (locally generated heat) generated by the driver circuit 12 and the LED 14 from the entire heat dissipation sheet 20a to the outside (for example, the first metal plate 3a).

The heat dissipation sheet 20b is affixed to the first metal plate 3a. Specifically, the heat dissipation sheet 20b is affixed over a wide range across a surface of the first metal plate 3a that faces the backlight unit 13 (the surface opposite to the surface on which the control circuit 15 is attached; the upper surface). Thereby, the heat absorbed at each position of the first metal plate 3a can be conducted to the entire first metal plate 3a. Moreover, the heat absorbed from places other than the first metal plate 3a can be conducted to the entire first metal plate 3a. Therefore, heat can be efficiently conducted to the second metal plate 3b that constitutes the side surfaces of the electronic device 1. That is, the heat generated inside the electronic device 1 can be efficiently conducted to the outside of the electronic device 1.

The heat dissipation sheet 20c is affixed to a lower surface of the shield case 17 (the surface opposite to the surface facing the first metal plate 3a). As a result, heat generated by the control circuit 15 and conducted through the shield case 17 can be absorbed and dissipated from the second member 4 to the outside of the electronic device 1.

Examples of the heat dissipation sheets 20a to 20c include a graphite sheet. By using the graphite sheet, locally generated heat can be conducted to the entire graphite sheet. Therefore, the heat dissipation sheets 20a to 20c can conduct heat to the outside while diffusing the heat. In particular, by using the graphite sheet as the heat dissipation sheet 20b, the heat absorbed by the first metal plate 3a can be efficiently conducted to the second metal plate 3b.

The heat dissipation sheet may be affixed to the heat generating component located at a position away from the first metal plate 3a. In this case, it is possible to conduct heat generated by the heat generating component to the outside of the electronic device 1 through the metal plate 3 or the like while diffusing the heat.

The thermally conductive member 21 is disposed between the first metal plate 3a and the control circuit 15 (specifically, the shield case 17), and conducts heat generated by the control circuit 15 to the first metal plate 3a. The thermally conductive member 21 is disposed between the first metal plate 3a and the camera 19, and conducts heat generated by the camera 19 to the first metal plate 3a. The thermally conductive member 21 is made of, for example, a heat dissipation material (TIM). By disposing the thermally conductive member 21 with respect to the heat generating component directly coupled to the first metal plate 3a such as the control circuit 15 and the camera 19, the heat generated by the heat generating component is efficiently conducted to the first metal plate 3a. Therefore, the heat can be efficiently conducted from the second metal plate 3b to the outside of the electronic device 1.

In general, considering that the shield case 17 and the metal plate 3 are electrically at the same potential, it is conceivable to couple the shield case 17 and the metal plate 3 with a member (that is, a member having a relatively high thermal resistivity) having a relatively low thermal conductivity. However, in this case, it is difficult to conduct heat generated by the control circuit 15 to the metal plate 3. Further, even when an air layer is formed between the shield case 17 and the metal plate 3, it is difficult to conduct heat generated by the control circuit 15 to the metal plate 3. By disposing the thermally conductive member 21 between the shield case 17 and the first metal plate 3a, the heat generated by the control circuit 15 can be efficiently conducted to the first metal plate 3a. The same can be said for the camera 19 in this regard.

Here, the thermally conductive member 21 is a member that conducts heat generated by the heat generating component, which is directly coupled to the first metal plate 3a, to the first metal plate 3a. On the other hand, the heat dissipation sheets 20a to 20c are members that conduct the heat to the inside and the outside while diffusing the heat over a wide range. From this point of view, the thermal conductivity of the heat dissipation sheets 20a to 20c may be higher than the thermal conductivity of the thermally conductive member 21.

Note that the thermal conductivity of the material used as the heat dissipation sheets 20a to 20c may be a value high enough to efficiently conduct the absorbed heat to the inside or the outside. For example, a material having a thermal conductivity of 1000 W/(m·K) or more in a horizontal direction may be used.

The battery 18 is not coupled to the first metal plate 3a via the thermally conductive member 21. This is because the battery 18 does not correspond to a heat generating component. When the battery 18 is coupled to the first metal plate 3a, the battery 18 becomes hot due to heat from the first metal plate 3a, which not desirable for safety.

Moreover, in this embodiment, although the metal plate 3 is exposed in all the side surfaces (four side surfaces) which constitutes the electronic device 1, it is not limited to this. That is, the metal plate 3 only needs to be exposed on at least one of a plurality of side surfaces constituting the electronic device 1. In this case, heat generated inside the electronic device 1 can be conducted to the outside of the electronic device 1 from the portion where the metal plate is exposed. For example, the metal plate 3 may be exposed from two side surfaces that extend in a longitudinal direction. (X axis direction) among the four side surfaces, and may not be exposed from the two side surfaces that extend in a short side direction (Y axis direction).

<Heat Dissipation Restriction Structure for Users>

As described above, since the electronic device 1 includes the metal plate 3, the heat generated inside the electronic device 1 can be efficiently dissipated to the outside. However, in a case where the second metal plate 3b is disposed at a place where a user's hand is apt to touch when the user holds the electronic device 1, the user may feel heat of the second metal plate 3b due to the heat generation inside the electronic device 1, and there may be a possibility that some users feel uncomfortable.

As shown in FIGS. 1A and 1B, in the electronic device 1, the outer surface 3bs of the second metal plate 3b is formed in further inside (deep position) the electronic device 1 than the first member 2 and the second member 4 in both the arrow guiding cross section taken along line A-A and in the arrow guiding cross section taken along line B-B of the electronic device 1. In other words, in the two cross sections of the electronic device 1, the first member 2 and the second member 4 protrude more than the second metal plate 1b. The arrow guiding cross section taken along line A-A is a cross section when the electronic device 1 is cut in parallel with the longitudinal direction of the electronic device 1, and the arrow guiding cross section taken along line B-B is a cross section when the electronic device 1 is cut in parallel with the short side direction of the electronic device 1.

Therefore, it is possible to make it difficult for a user's hand to touch the second metal plate 3b when the user holds or operates the electronic device 1. Moreover, even when the second metal plate 3b is touched, the contact area can be made small.

Generally, when a user touches a member having a low thermal conductivity, the user is less likely to feel hot than a member having a high thermal conductivity. Accordingly, since the second metal plate 3b is formed further inside the electronic device 1 than the first member 2 and the second member 4, the user is less likely to feel the electronic device 1 hot when holding or operating the electronic device 1.

In this way, in the electronic device 1, the metal plate 3 is disposed/positioned so that the exposed surface of the metal plate 3 may become a place where a user's hand is not apt to touch. Therefore, it is possible to conduct the heat generated inside the electronic device 1 to the outside of the electronic device 1 from the place where the user is not apt to touch. Therefore, it is possible to suppress that the heat generation inside the electronic device 1 gives a user discomfort. Since the first member 2 and the second member 4 protrude more than the second metal plate 3b, it is possible to make it difficult to slip off from a user's hand when holding the electronic device 1.

In general, since a portable terminal is small, it is difficult to form a space (air-cavity) for relaxing local heat generation therein. In the electronic device 1, by setting the electronic device 1 as the above configuration, it is possible to suppress giving the user the discomfort due to heat, without providing the space. That is, the configuration of the electronic device 1 functions particularly effectively for a small electronic device such as a portable terminal.

In the present embodiment, the outer surface 3bs of the second metal plate 3b is formed in a concave shape that is recessed toward the inside of the electronic device 1. Specifically, the outer surface 3bs of the second metal plate 3b has a curved shape that is recessed toward the inside of the electronic device 1. Thereby, it is possible to make it difficult for the user's hand to touch the metal plate 3b. The outer surface 3bs of the second metal plate 3b may be, for example, a planar shape or may have a convex shape that swells outer-side of the electronic device 1b as long as the outer surface 3bs of the second metal plate 3b is formed further inside (deep position) the electronic device 1 than the first member 2 and the second member 4.

Note that the outer surface 3bs of the second metal plate 3b only needs to be formed further inside the electronic device 1 than the first member 2 and the second member 4 such that a user's hand does not touch at least near the center when holding the electronic device 1. Desirably, it may just be formed to such an extent that a user's hand does not touch any place of the outer surface 3bs.

Embodiment 2

Figure 3:
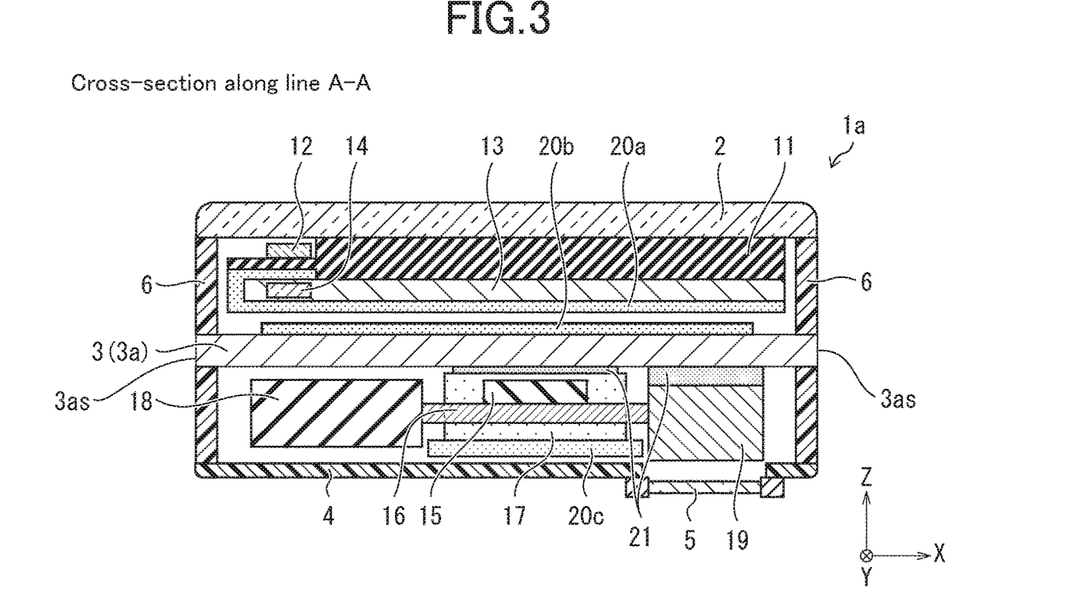
FIG. 3 a schematic cross-sectional diagram showing an example of an electronic device according to Embodiment 2.

Other embodiments of the present disclosure will be described below with reference to FIG. 3. For convenience of explanation, members having the same functions as those described in the above embodiment are given the same reference numerals, and the description thereof will not be repeated. FIG. 3 is a schematic cross-sectional diagram showing an example of an electronic device 1a according to Embodiment 2. Specifically, FIG. 3 is an arrow guiding cross-sectional diagram taken along line A-A of the electronic device 1a. The arrow guiding cross-sectional diagram taken along line B-B of the electronic device 1a is the same as the arrow guiding cross-sectional diagram taken along line B-B of the electronic device 1 shown in FIG. 1B.

In the electronic device 1 according to Embodiment 1, the second metal plate 3b having the outer surface 3bs formed in a concave shape that is recessed toward the inside of the electronic device 1 is disposed on all side surfaces constituting the electronic device 1. That, in the electronic device 1, the second metal plate 3b having the outer surface 3bs formed in the concave shape is disposed on both the side surfaces in a longitudinal direction and the side surfaces in a short side direction.

In the electronic device 1a of Embodiment 2, shapes are different between the side surface in the longitudinal direction and the side surface in the short side direction. As shown in FIG. 1B, the second metal plate 3b having the outer surface 3bs formed in the concave shape is disposed on the side surface in the longitudinal direction. That is, the outer surface 3bs of the second metal plate 3b is formed on the side surface in the longitudinal direction so as to be further inside (deep position) than the first member 2 and the second member 4. Therefore, on the side surface in the longitudinal direction, the possibility that the user's hand touches the second metal plate 3b that conducts heat generated inside the electronic device 1a to the outside of the electronic device 1a can be reduced.

Here, the area of the side surface of the electronic device 1a in the longitudinal direction is larger than the area of the side surface in the short side direction. Therefore, the heat generated inside the electronic device 1a is more easily conducted to the outside of the electronic device 1a on the side surface in the longitudinal direction, and as a result, the temperature is likely to rise. Thus, it is more desirable to form the outer surface 3bs of the second metal plate 3b, which functions as the side surface in the longitudinal direction, in a concave shape than in the concave shape on the side surface in the short side direction.

On the other hand, as shown in FIG. 3, on the side surface of the electronic device 1a in the short side direction, the second metal plate 3b having the outer surface 3bs formed so that it may become further inside (deep position) than the first member 2 and the second member 4 is not disposed. Specifically, a third member 6 having a planar shape is disposed at a position that is not further inside than the first member 2 and the second member 4, thereby forming the side surface in the short side direction. Similar to the first member 2 and the second member 4, the third member 6 is a portion where the user's hand is apt to touch when holding or operating the electronic device 1a. Therefore, the third member 6 is made of a material having a thermal conductivity lower than that of the metal plate 3 (member used as a heat dissipation member) at least. For example, the third member 6 may be made of the same material (for example, resin or glass) as the first member 2 or the second member 4.

The through groove is formed in the third member 6, and the side surface of the first metal plate 3a is exposed to the outside of the electronic device 1a as an exposed surface of the metal plate 3 from the through groove. Thereby, the heat generated inside the electronic device 1 can be conducted from the side surface of the first metal plate 3a to the outside of the electronic device 1a.

On the side surface in the short side direction, there is a possibility that the user's hand may touch the side surface of the first metal plate 3a exposed from the through groove when holding or operating the electronic device 1a. However, the possibility that the user touches the side surface in the short side direction when holding or operating the electronic device 1a is lower than that in the side surface in the longitudinal direction. Therefore, at least on the side surface in the longitudinal direction, it is possible to suppress that the user's hand touches the side surface in the longitudinal direction where the user's hand is apt to touch when the exposed surface of the metal plate is formed further inside the electronic device 1a than the first member 2 and the second member 4.

Note that the side surface 3as of the first metal plate 3a is in the same plane as the side surface of the electronic device 1a. That is, the first metal plate 3a does not protrude from the side surface of the electronic device 1a. Therefore, the contact area when the first metal plate 3a is touched can be made small.

Further, in the present embodiment, the metal plate 3 only needs to be exposed on at least one of a plurality of side surfaces constituting the electronic device 1a.

Embodiment 3

Figure 4:
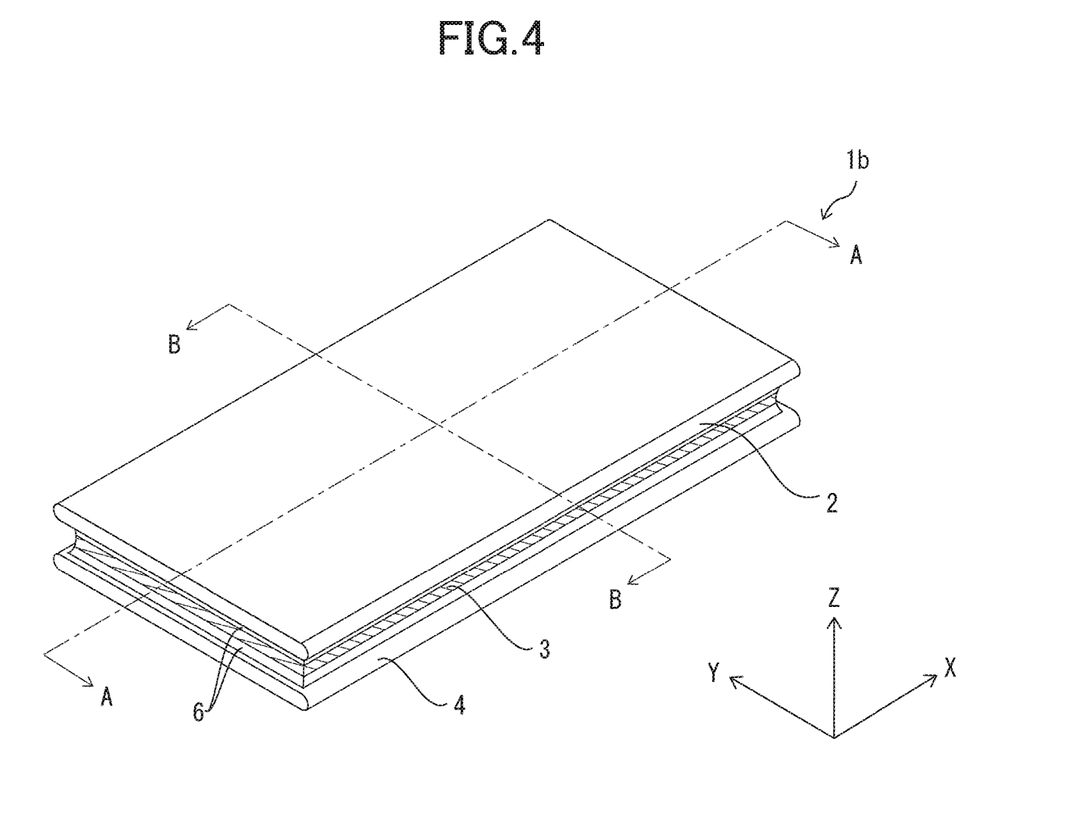
FIG. 4 is a perspective diagram showing an example of an external appearance of an electronic device according to Embodiment 3.
Figure 5A:
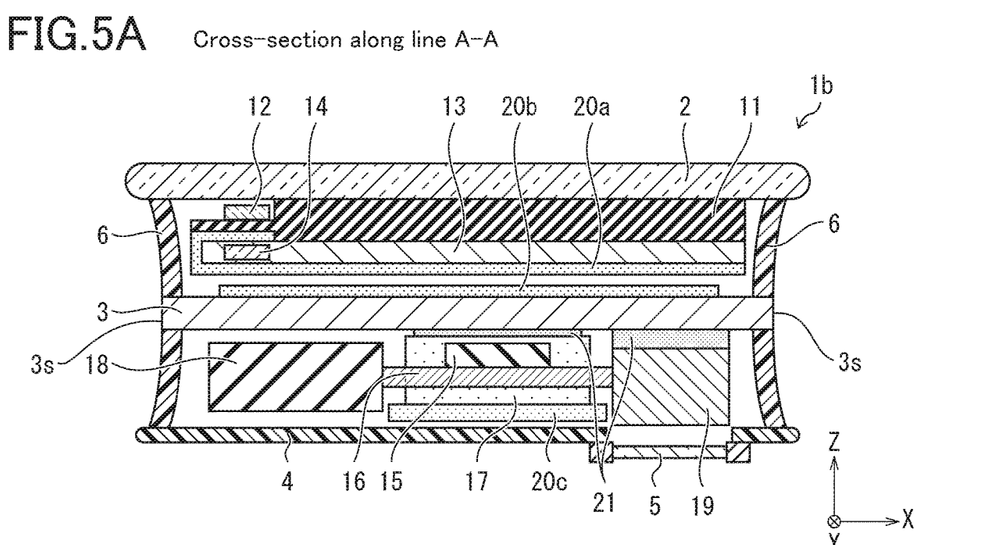
FIG. 5A is a schematic cross-sectional diagram showing an example of the electronic device according to Embodiment 3.
Figure 5B:
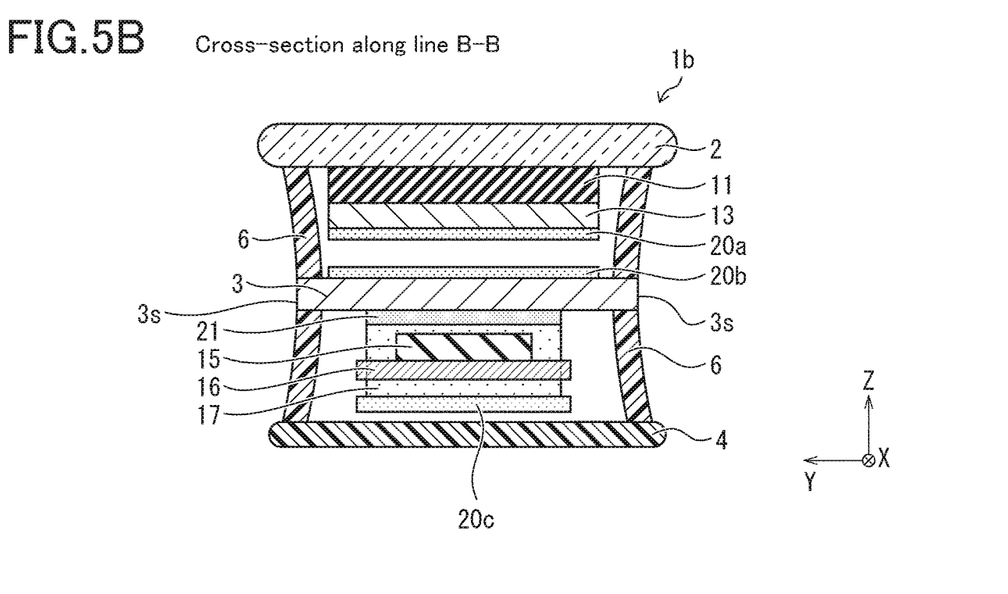
FIG. 5B is a schematic cross-sectional diagram showing an example of the electronic device according to Embodiment 3.

Other embodiments of the present disclosure will be described below with reference to FIGS. 4, 5A, and 5B. For convenience of explanation, members having the same functions as those described in the above embodiment are given the same reference numerals, and the description thereof will not be repeated. FIG. 4 is a perspective diagram showing an example of an external appearance of an electronic device 1b according to Embodiment 3. FIGS. 5A and 5B are schematic cross-sectional diagrams showing an example of the electronic device 1b according to Embodiment 3.

As shown in FIG. 4, the electronic device 1b includes first member 2 that constitutes a front surface of the electronic device 1b and a second member 4 that constitutes a back surface of the electronic device 1b. Further, the electronic device 1b includes a metal plate 3 and a third member 6 that are disposed between the first member 2 and the second member 4 and constitute the side surface of the electronic device 1b. As described above, the electronic device 1b differs from the electronic device 1 of Embodiment 1 in that the four side surfaces of the electronic device 1b are configured not only with the metal plate 3 (a second metal plate 3b) but also with the metal plate 3 and the third member 6. The metal plate 3 in the present embodiment corresponds to the first metal plate 3a in Embodiment 1.

As shown in FIGS. 5A and 5B, the third member 6 has a concave shape (curved shape) that is recessed toward the inside of the electronic device 1b in both the arrow guiding cross section taken along line A-A and in the arrow guiding cross section taken along line B-B. Further, a through groove is formed in the third member 6, and a side surface 3s of the metal plate 3 is exposed to the outside of the electronic device 1b as an exposed surface of the metal plate 3 from the through groove. However, the side surface 3s of the metal plate 3 exists on the same curved surface as the side surface of the third member 6. That is, the side surface of the electronic device 1b configured with the third member 6 and the metal plate 3 is formed in a concave shape that is recessed toward the inside of the electronic device 1b.

In this way, in the electronic device 1b, heat generated inside the electronic device 1b canal be conducted to the outside of the electronic device 1b from the side surface 3s of the metal plate 3 exposed to the outside of the electronic device 1b. Further, it is possible to make it difficult for a user's hand to touch the metal plate 3 when holding or operating the electronic device 1b. That is, it is possible to conduct the heat generated inside the electronic device 1b to the outside of the electronic device 1b from a place where the user is not apt to touch.

Note that the third member 6 may be, for example, a planar shape or a convex shape that swells outer-side as long as at least the place (that is, the side surface 3s of the metal plate 3) where the through groove is formed is positioned further inside the electronic device 1b (deep inside) than the first member 2 and the second member 4.

Further, the side surface 3s of the metal plate 3 does not desirably have to exist on the same curved surface as the side surface of the electronic device 1b. As long as the side surface 3s of the metal plate 3 is formed further inside than the first member 2 and the second member 4, for example, the side surface 3s may protrude from the side surface of the electronic device 1b. In this case, the heat generated inside the electronic device 1b can be more efficiently conducted to the outside of the electronic device 1b.

In the present embodiment, the metal plate 3 only needs to be exposed on at least one of a plurality of side surfaces constituting the electronic device 1b. Further, in all of a plurality of side surfaces constituting the electronic device 1b, the side surface 3s of the metal plate 3 may not be formed further inside than the first member 2 and the second member 4. For example, like the electronic device 1b of Embodiment 2, the side surface 3s of the metal plate 3 may be formed further inside than the first member 2 and the second member 4 only on the side surface in the longitudinal direction.

Embodiment 4

Figure 6A:
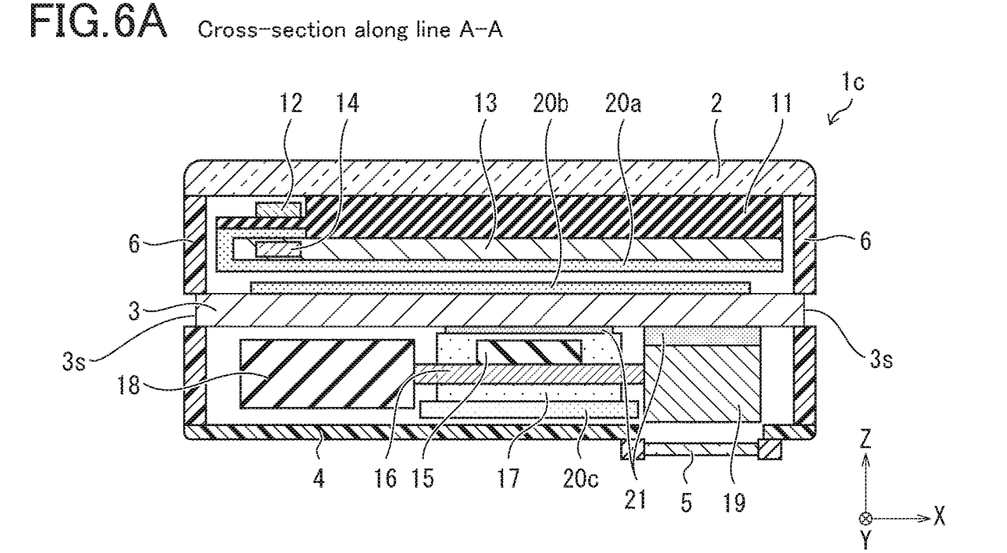
FIG. 6A is a schematic cross-sectional diagram showing an example of an electronic device according to Embodiment 4.
Figure 6B:
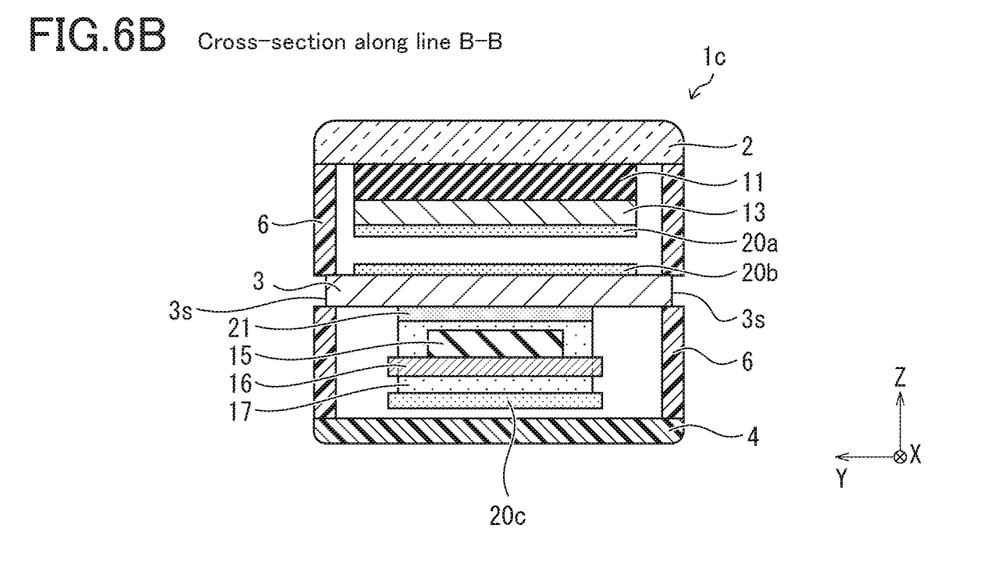
FIG. 6B is a schematic cross-sectional diagram showing an example of an electronic device according to Embodiment 4.

Other embodiments of the present disclosure will be described below with reference to FIGS. 6A and 6B. For convenience of explanation, members having the same functions as those described in the above embodiment are given the same reference numerals, and the description thereof will not be repeated. FIGS. 6A and 6B are schematic cross-sectional diagrams showing an example of the electronic device 1c according to Embodiment 4.

As shown in FIGS. 6A and 6B, same as the electronic device 1b, the electronic device 1c is configured with the third member 6 and the metal plate 3 (corresponding to the first metal plate 3a of Embodiment 1) on the four side surfaces of the electronic device 1c. On the other hand, the electronic device 1c differs from the electronic device 1b in the following points. The third member 6 has a planar shape and is disposed at a position that is not further inside than the first member 2 and the second member 4, thereby forming the side surface of the electronic device 1c. Further, the side surface 3s (the above-described exposed surface) of the metal plate 3 exposed from the through groove of the third member 6 is formed so as to be further inside than the outer surface of the third member 6. That is, the side surface 3s of the metal plate 3 is formed further inside (deep position) the electronic device 1c than the first member 2 and the second member 4 and is formed a part of a concave shape that is recessed toward the inside of the electronic device 1c.

Therefore, also in the electronic device 1c, the heat generated inside the electronic device 1c can be conducted to the outside of the electronic device 1c from the side surface 3s of the metal plate 3 exposed to the outside of the electronic device 1c. Further, it is possible to make it difficult for the user's hand to touch the metal plate 3 when holding or operating the electronic device 1c. That is, it is possible to conduct the heat generated inside the electronic device 1c to the outside of the electronic device 1c from a place where the user is not apt to touch.

Note that the configuration of the present embodiment can also be applied to the electronic device 1a (see FIG. 3) of Embodiment 2. That is, on the side surface of the electronic device 1a in the short side direction, the side surface 3as of the first metal plate 3a may be formed so as to be further inside than the outer surface of the third member 6. In this case, it is possible to make it difficult for the user's hand to touch the first metal plate 3a on the side surface of the electronic device 1a in the short side direction.

[Wrap-Up]

An electronic device according to aspect 1 of the present disclosure includes a heat dissipation member having a higher thermal conductivity than a first member constituting a front surface of the electronic device and a second member constituting a back surface of the electronic device and being disposed inside the electronic device, in which the heat dissipation member is exposed on at least one of a plurality of side surfaces of the electronic device so as to absorb heat from a heat generating component that generates heat inside the electronic device and guide the heat to an outside of the electronic device, and an exposed surface of the heat dissipation member exposed to the outside is formed further inside the electronic device than the first member and the second member.

In the electronic device according to aspect 2 of the present disclosure, in the above-described aspect 1, the exposed surface of the heat dissipation member may be formed in a concave shape that is recessed toward the inside of the electronic device.

In the electronic device according to aspect 3 of the present disclosure, in the above-described aspect 1 or 2, the heat dissipation member may be a metal plate.

In the electronic device according to aspect 4 of the present disclosure, in the above-described aspect 3, the metal plate may be integrally molded.

In the electronic device according to aspect 5 of the present disclosure, in any one of the above-described aspects 1 to 4, a graphite sheet may be affixed to the heat dissipation member.

In the electronic device according to aspect 6 of the present disclosure, in any one of the above-described aspects 1 to 5, the exposed surface of the heat dissipation member is disposed on a longitudinal side surface of the electronic device.

In addition, a portable device (a portable terminal) as an electronic device according to one aspect of the present disclosure can be represented as follows. That is, in the portable device, a cross-sectional shape of the end of a holding portion of the portable device is a multilayer structure, upper and lower layers have a cross-sectional shape that is more convex than a center layer, and the upper and lower layers are made of materials having lower thermal conductivity than the central layer. Thereby, it is possible to make it difficult to feel heat in a hand when a user holds the portable device.

ADDITIONAL NOTES

The present disclosure is not limited to the above-described embodiments and various modifications can be made within the scope of the claims, and embodiments obtained by appropriately combining technical means disclosed in different embodiments are also included in the technical scope of the present disclosure. Furthermore, new technical features can be formed by combining the technical means disclosed in each embodiment.

The present disclosure contains subject matter related to that disclosed in Japanese Priority Patent Application JP 2018-187623 filed in the Japan Patent Office on Oct. 2, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
a heat dissipation member having a thermal conductivity higher than a thermal conductivity of a first member, the first member comprising a front surface of the electronic device and a second member comprising a back surface of the electronic device and located inside the electronic device,
wherein the heat dissipation member is exposed on at least one of a plurality of side surfaces of the electronic device to absorb heat from a heat generating component that generates heat inside the electronic device and guide the heat outside the electronic device, and
wherein in a sectional view traversing the heat dissipation member, the first member, and the second member, the heat dissipation member is between the first member and the second member, and each exposed surface of the heat dissipation member is formed further inside the electronic device than the first member and the second member.

2. The electronic device according to claim 1, wherein the exposed surface of the heat dissipation member is formed in a concave shape that is recessed toward the inside of the electronic device.

3. The electronic device according to claim 1, wherein the heat dissipation member is a metal plate.

4. The electronic device according to claim 3, wherein the metal plate is integrally molded.

5. The electronic device according to claim 1, wherein a graphite sheet is affixed to the heat dissipation member.

6. The electronic device according to claim 1, wherein the exposed surface of the heat dissipation member is disposed on a longitudinal side surface of the electronic device.

* * * * *